United States Patent
Kimura et al.

(10) Patent No.: US 8,232,808 B2
(45) Date of Patent: Jul. 31, 2012

(54) SWITCH CIRCUIT, FILTER CIRCUIT AND TEST APPARATUS

(75) Inventors: Hiroki Kimura, Tokyo (JP); Chisato Maeda, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/207,506

(22) Filed: Sep. 10, 2008

(65) Prior Publication Data

US 2009/0230978 A1   Sep. 17, 2009

Related U.S. Application Data

(63) Continuation of application No. PCT/JP2007/058983, filed on Apr. 25, 2007.

(30) Foreign Application Priority Data

May 10, 2006 (JP) ................................ 2006-131812

(51) Int. Cl.
  *G01R 31/02* (2006.01)
(52) U.S. Cl. .......................... 324/537; 327/605; 327/629
(58) Field of Classification Search .................... 324/537
  See application file for complete search history.

(56) References Cited

U.S. PATENT DOCUMENTS

| | | | |
|---|---|---|---|
| 6,466,029 B2 * | 10/2002 | Stroth et al. | 324/509 |
| 6,636,066 B2 * | 10/2003 | Shimoda | 324/765 |
| 6,911,848 B2 * | 6/2005 | Vinciarelli | 327/108 |
| 6,927,989 B2 * | 8/2005 | Fukumoto | 363/95 |
| 7,190,124 B2 * | 3/2007 | Kumar et al. | 315/224 |
| 7,250,804 B2 * | 7/2007 | Brindle | 327/365 |
| 2004/0113746 A1 | 6/2004 | Brindle | |

FOREIGN PATENT DOCUMENTS

| | | |
|---|---|---|
| JP | 06-334463 | 12/1994 |
| JP | 08-032431 | 2/1996 |
| JP | 08-293776 | 11/1996 |
| JP | 10-336000 | 12/1998 |

OTHER PUBLICATIONS

Toshio, Maki. JPO Machine Translation of JP 08-032431, Nov. 11, 2010, p. 1-14.*
Toshio, Maki; "Signal Switch", PTO Translation of JP 08032431, Dec. 2010.*
Office Action for Japanese Patent Application No. 2008-514435 mailed Mar. 13, 2012, with English translation thereof (5 pages).

* cited by examiner

*Primary Examiner* — Thomas Valone
(74) *Attorney, Agent, or Firm* — Osha Liang LLP

(57) ABSTRACT

There is provided a switch circuit for switching whether to output an input signal, including: a transmission path that transmits the input signal from an input end to an output end of the switch circuit; a first semiconductor switch that is provided on the transmission path and switches whether to transmit the input signal; a second semiconductor switch that is opened when the first semiconductor switch is short-circuited, and that is short-circuited when the first semiconductor switch is opened, thereby grounding, to a ground potential, a high-frequency signal leaked to the transmission path between the first semiconductor switch and the output end; and a voltage controller that causes a potential difference on both ends of the second semiconductor switch when the second semiconductor switch is opened.

13 Claims, 5 Drawing Sheets

SWITCH CIRCUIT, FILTER CIRCUIT AND TEST APPARATUS

CROSS REFERENCE TO RELATED APPLICATION

This is a continuation application of PCT/JP2007/058983 filed on Apr. 25, 2007 which claims priority from a Japanese Patent Application(s) No. 2006-131812 filed on May 10, 2006, the contents of which are incorporated herein by reference.

BACKGROUND

1. Technical Field

The present invention relates to a switch circuit, a filter circuit, and a test apparatus. In particular, the present invention relates to a switch circuit for switching whether to output an input signal, and to a filter circuit and a test apparatus including the switch circuit.

2. Related Art

A T switch circuit and an L switch circuit, which use a semiconductor switch, are known to be fast and have a favorable insulation property when opened. The T switch circuit and the L switch circuit include a first semiconductor switch for switching short-circuit/opening of an input end and an output end, and a second semiconductor switch for switching short-circuit/opening of a transmission path and a ground potential, where the transmission path is of the input end and the output end.

In the T switch circuit and the L switch circuit, the second semiconductor switch is opened when the first semiconductor switch is short-circuited, and is short-circuited when the first semiconductor switch is opened. Consequently, when the first semiconductor switch is opened, the second semiconductor switch can ground, to a ground potential, a high-frequency signal inputted via a parasitic capacitance of the first semiconductor switch. Accordingly, the T switch circuit and the L switch circuit do not output a leakage signal inputted from either the input end or the output end from the other end, thereby leading to improvement in insulation property at the time of opening.

So far, no related patent document is recognized, and so the description thereof is omitted.

A semiconductor switch has a capacitance between output terminals. Therefore, while the first semiconductor switch is short-circuited, a T switch or an L switch has deformed a signal passing between the input end and the output end due to the capacitance between output terminals that depends on the voltage between terminals in the second semiconductor switch.

SUMMARY

Therefore, it is an object of an aspect of the innovations herein to provide a switch circuit, a filter circuit, and a test apparatus, which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, provided is one exemplary switch circuit for switching whether to output an input signal, including: a transmission path that transmits the input signal from an input end to an output end of the switch circuit; a first semiconductor switch that is provided on the transmission path and switches whether to transmit the input signal; a second semiconductor switch that is opened when the first semiconductor switch is short-circuited, and that is short-circuited when the first semiconductor switch is opened, thereby grounding, to a ground potential, a high-frequency signal leaked to the transmission path between the first semiconductor switch and the output end; and a voltage controller that causes a potential difference on both ends of the second semiconductor switch when the second semiconductor switch is opened.

According to the second aspect related to the innovations herein, provided is one exemplary filter circuit for allowing a predetermined frequency component of an input signal to pass through, including: a first filter and a second filter that have different frequency characteristics from each other that determine which frequency component of the input signal is allowed to pass therethrough; a first switch circuit that switches whether to input the input signal to the first filter; and a second switch circuit that switches whether to input the input signal to the second filter, where the first switch circuit and the second switch circuit include: a transmission path that transmits the input signal from an input end to an output end of the switch circuit; a first semiconductor switch that is provided on the transmission path and switches whether to transmit the input signal; a second semiconductor switch that is opened when the first semiconductor switch is short-circuited, and that is short-circuited when the first semiconductor switch is opened, thereby grounding, to a ground potential, a high-frequency signal leaked to the transmission path between the first semiconductor switch and the output end; and a voltage controller that causes a potential difference on both ends of the second semiconductor switch when the second semiconductor switch is opened.

According to the third aspect related to the innovations herein, provided is one exemplary test apparatus for testing a device under test, the test apparatus including: a signal generator that generates a test signal to be inputted to the device under test; a filter circuit that allows a predetermined frequency component of the test signal to pass through to be inputted to the device under test; and a determining section that determines whether the device under test is defective or not, based on an output signal outputted by the device under test in response to the test signal, where the filter circuit includes: a first filter and a second filter that have different frequency characteristics from each other that determine which frequency component of the test signal is allowed to pass therethrough; a first switch circuit that switches whether to input the test signal to the first filter; and a second switch circuit that switches whether to input the test signal to the second filter, and where the first switch circuit and the second switch circuit include: a transmission path that transmits the test signal from an input end to an output end of the switch circuit; a first semiconductor switch that is provided on the transmission path and switches whether to transmit the test signal; a second semiconductor switch that is opened when the first semiconductor switch is short-circuited, and that is short-circuited when the first semiconductor switch is opened, thereby grounding, to a ground potential, a high-frequency signal leaked to the transmission path between the first semiconductor switch and the output end; a voltage controller that controls a potential at one end of the second semiconductor switch; and a voltage controller that causes a potential difference on both ends of the second semiconductor switch when the second semiconductor switch is opened.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Figure 1:
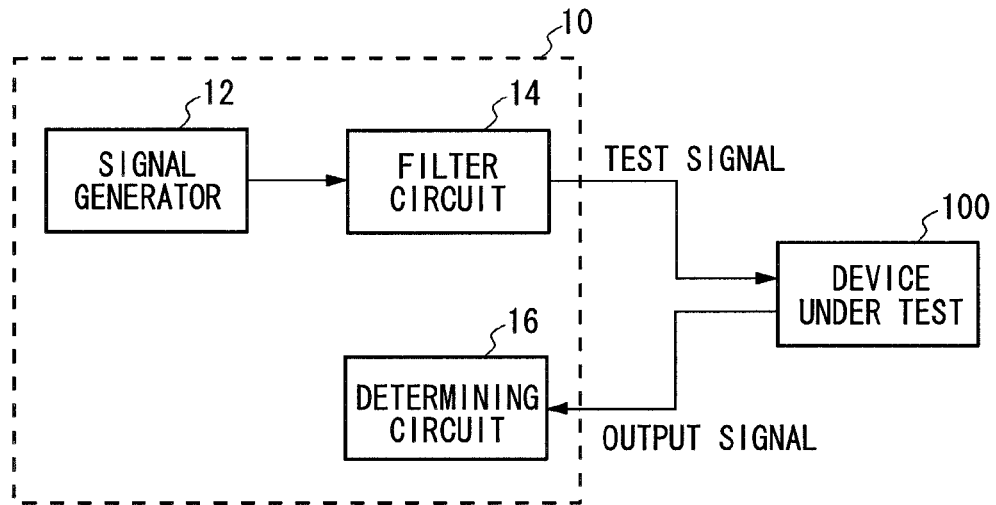
FIG. 1 shows a configuration of a test apparatus 10 according to a first embodiment of the present invention, together with a device under test 100.

Some aspects of the invention will now be described based on the embodiments, which do not intend to limit the scope of the present invention, but exemplify the invention. All of the features and the combinations thereof described in the embodiment are not necessarily essential to the invention. The same or similar elements may occasionally be provided with the same reference numeral, with the related description thereof omitted.

FIG. 1 shows a configuration of a test apparatus 10 according to a first embodiment of the present invention, together with a device under test 100. The test apparatus 10 tests the device under test 100. The test apparatus 10 includes a signal generator 12, a filter circuit 14, and a determining section 16. The signal generator 12 generates a test signal to be inputted to the device under test 100. The filter circuit 14 allows a predetermined frequency component of the test signal generated by the signal generator 12 to pass through and to be inputted to the device under test 100. The determining section 16 determines whether the device under test 100 is defective or not based on an output signal outputted by the device under test 100 in response to the test signal.

Figure 2:
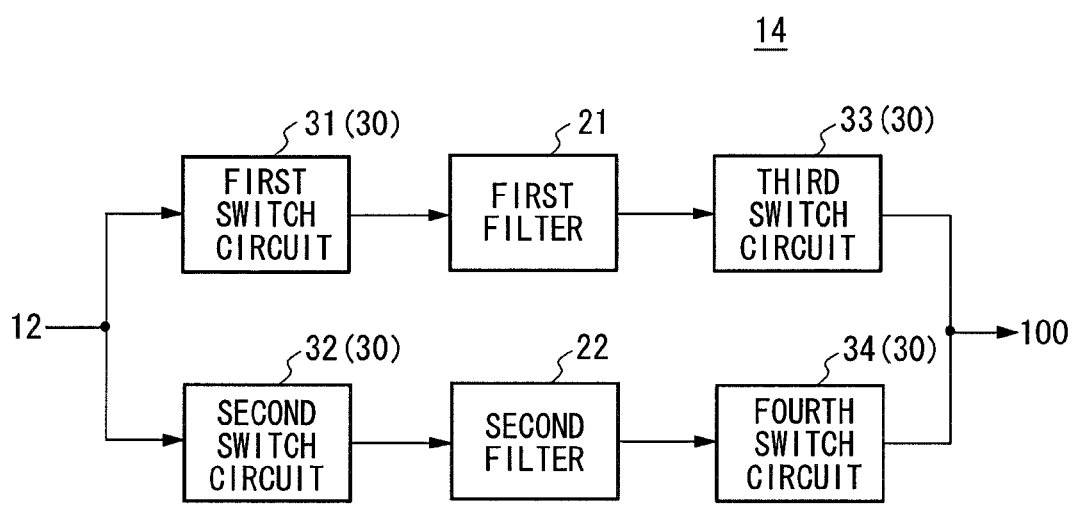
FIG. 2 shows a configuration of a filter circuit 14 according to the first embodiment of the present invention.

FIG. 2 shows the configuration of the filter circuit 14 according to the first embodiment. The filter circuit 14 includes a first filter 21, a second filter 22, a first switch circuit 31, a second switch circuit 32, a third switch circuit 33, and a fourth switch circuit 34. The first filter 21 receives the test signal generated by the signal generator 12 via the first switch circuit 31, and allows a predetermined frequency component of the input signal to pass through and be outputted to the device under test 100 through the third switch circuit 33. The first switch circuit 31 switches whether to input, to the first filter 21, the test signal generated by the signal generator 12. The third switch circuit 33 switches whether to output, to the device under test 100, the signal having passed through the first filter 21.

The second filter 22 receives the test signal generated by the signal generator 12, via the second switch circuit 32, and allows a predetermined frequency component of the input signal to pass through and be outputted to the device under test 100 via the fourth switch circuit 34. The second switch circuit 32 switches whether to input, to the second filter 22, the test signal generated by the signal generator 12. The fourth switch circuit 34 switches whether to output, to the device under test 100, the signal having passed through the second filter 22. Then the first filter 21 and the second filter 22 have different frequency characteristics from each other that determine which frequency component of the input signal is allowed to pass therethrough.

The filter circuit 14 is controlled to short-circuit or open the first through the fourth switch circuits 31-34, according to the frequency component which it passes through. For example, when passing the frequency component defined by the frequency characteristic of the first filter 21, the filter circuit 14 controls to short-circuit the first switch circuit 31 and the third switch circuit 33, and to open the second switch circuit 32 and the fourth switch circuit 34. When passing the frequency component defined by the frequency characteristic of the second filter 22, the filter circuit 14 controls to open the first switch circuit 31 and the third switch circuit 33, and to short-circuit the second switch circuit 32 and the fourth switch circuit 34. In this way, the filter circuit 14 is able to selectively output a frequency component included in the test signal (input signal) generated by the signal generator 12, to the device under test 100. Note that the first through the fourth switches 31-34 may have substantially the same configuration as each other. As follows, the first through the fourth switches 31-34 are collectively referred to as a switch circuit 30.

In the present embodiment, the filter circuit 14 may include, in addition to the first filter 21 and the second filter 22, one or more filters having different frequency characteristics from each other that determine which frequency component of the input signal is allowed to pass therethrough. In this case, the filter circuit 14 includes, for each filter, one or more switches for switching whether to input a test signal generated by the signal generator 12 to a corresponding filter, and one or more switches for switching whether to output a signal having passed a corresponding filter to the device under test 100. Accordingly, the filter circuit 14 according to the present embodiment is able to selectively pass a multitude of frequency components.

Figure 3:
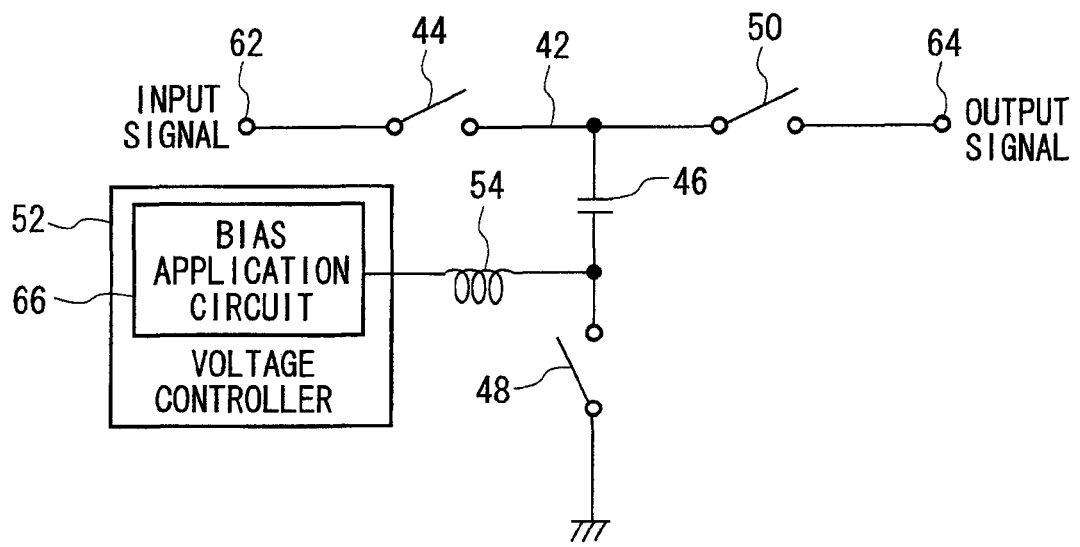
FIG. 3 shows a configuration of a switch circuit 30 according to the first embodiment of the present invention.

FIG. 3 shows a configuration of a switch circuit 30 according to the first embodiment. The switch circuit 30 includes a transmission path 42, a first semiconductor switch 44, a capacitor 46, a second semiconductor switch 48, a third semiconductor switch 50, a voltage controller 52, and an inductor 54, for switching whether to output an input signal.

The transmission path 42 is formed between an input terminal 62 and an output terminal 64, and transmits an input signal inputted through the input terminal 62 from the input terminal 62 to the output terminal 64 of the switch circuit 30. The first semiconductor switch 44 is provided for the transmission path 42, and switches whether to transmit the input signal inputted from the input terminal 62 through the transmission path 42. That is, the first semiconductor switch 44 is provided between the input terminal 62 and the output terminal 64, and switches whether to short-circuit or open the input terminal 62 and the output terminal 64.

The capacitor 46 has a predetermined capacitance and is provided between the transmission path 42 between the first semiconductor switch 44 and the output terminal 64, and the ground potential. Because of having a predetermined capacitance, the capacitor 46 is able to cut off the direct current flowing between the transmission path 42 between the first semiconductor switch 44 and the output terminal 64, and the ground potential, while passing the alternate current. The second semiconductor switch 48 opens the capacitor 46 and the ground potential when the first semiconductor switch 44 is short-circuited. The second semiconductor switch 48 short-circuits the capacitor 46 and the ground potential when the first semiconductor switch 44 is opened.

The third semiconductor switch 50 is provided on the transmission path 42 between the connection point between the transmission path 42 and the capacitor 46, and the output terminal 64. The third semiconductor switch 50 operates in synchronization with the first semiconductor switch 44. That is, the third semiconductor switch 50 switches short-circuit and opening of the input terminal 62 and the output terminal 64, in synchronization with the first semiconductor switch 44.

The voltage controller 52 controls the potential of the connection point between the capacitor 46 and the second semiconductor switch 48. The voltage controller 52 may include a bias application circuit 66 operable to apply a predetermined bias voltage to a connection point between the capacitor 46 and the second semiconductor switch 48. The voltage controller 52 may use the bias application circuit 66 to apply a predetermined bias voltage to the connection point between the capacitor 46 and the second semiconductor switch 48.

The inductor 54 has a predetermined inductance, and is provided between the voltage controller 52 and a connection point that lies between the capacitor 46 and the second semiconductor switch 48. Because of having a predetermined inductance, the inductor 54 is able to cut off the alternate current flowing between the voltage controller 52 and the connection point that lies between the capacitor 46 and the second semiconductor switch 48, while passing the direct current.

The switch circuit 30 having the above-described configuration operates as follows. When being controlled to cut off the input from the output, the first semiconductor switch 44 and the third semiconductor switch 50 open the input terminal 62 and the output terminal 64. Accordingly, the switch circuit 30 cuts-off the signal passing between the input terminal 62 and the output terminal 64, and does not output an input signal. In this case, the second semiconductor switch 48 further short-circuits the capacitor 46 and the ground potential. In this way, even when the high-frequency signal inputted through the input terminal 62 or the output terminal 64 has passed through the parasitic capacitance of the first semiconductor switch 44 or of the third semiconductor switch 50, the capacitor 46 and the second semiconductor switch 48, in collaboration, can ground the high-frequency signal to the ground potential. Therefore, the switch circuit 30 does not output a leak signal inputted through the input terminal 62 or the output terminal 64 at the time of opening from the opposite terminal, thereby leading to improvement in insulation property at the time of opening.

When the switch circuit 30 is controlled to conduct the input to the output, the first semiconductor switch 44 and the third semiconductor switch 50 short-circuit the input terminal 62 and the output terminal 64. Accordingly, the switch circuit 30 is able to connect the input terminal 62 and the output terminal 64, to output an input signal from the output terminal 64. In this case, the second semiconductor switch 48 further opens the capacitor 46 and the ground potential, and the bias application circuit 66 of the voltage controller 52 applies a predetermined bias voltage to the connection point between the capacitor 46 and the second semiconductor switch 48.

Note that the capacitance between output terminals of a semiconductor switch becomes small when the voltage between terminals is high. Also, when the capacitance between output terminals of a semiconductor switch is small, the insulating property of the high-frequency signal improves. Therefore, when one end of the second semiconductor switch 48 is provided with a predetermined bias voltage and the other end thereof is provided with a ground potential, the semiconductor switch 48 has an increased voltage between terminals, thereby leading to improvement in insulation property of the high-frequency signal.

Consequently, the switch circuit 30 is able to reduce leakage of the signal passing between the input terminal 62 and the output terminal 64, towards the ground potential via the second semiconductor switch 48. That is, the switch circuit 30 is able to reduce the effect exerted by the second semiconductor switch 48 on the signal passing between the input terminal 62 and the output terminal 64. Furthermore, since the inductor 54 cuts off the high frequency signal, the signal passing between the input terminal 62 and the output terminal 64 in the switch circuit 30 is prevented from leaking towards the ground potential through the voltage controller 52.

In the switch circuit 30, the change in capacitance between terminals relative to the voltage between terminals of the second semiconductor switch 48 may be a cause of non-linearity of the transmission characteristic between the input terminal 62 and the output terminal 64. That is, when the change ratio of the capacitance between terminals relative to the voltage between terminals is large in the second semiconductor switch 48, the switch circuit 30 deforms the signal passing between the input terminal 62 and the output terminal 64. As opposed to this, the change ratio of the capacitance between output terminals of a semiconductor switch relative to the voltage between terminals becomes small as the voltage between terminals gets large. Therefore, since the voltage controller 52 causes a large voltage between terminals in the second semiconductor switch 48, the switch circuit 30 is able to pass a signal between the input terminal 62 and the output terminal 64 with little deformation. Consequently, the switch circuit 30 is able to improve the linearity of the transmission characteristic of the transmission path 42 between the input terminal 62 and the output terminal 64 at the time of short-circuit.

In the voltage controller 52, the bias application circuit 66 may apply a bias voltage corresponding to the rated voltage of the second semiconductor switch 48. The bias application circuit 66 may apply a bias voltage, the value of which is obtained by subtracting a predetermined voltage value from the rated voltage of the second semiconductor switch 48. Or, the bias voltage applied by the bias application circuit 66 may be close to but no greater than the rated voltage of the second semiconductor switch 48. As a result, the bias application circuit 66 can reduce the capacitance between output terminals of the second semiconductor switch 48 within the range in which the operation of the second semiconductor switch 48 is compensated.

Figure 4:
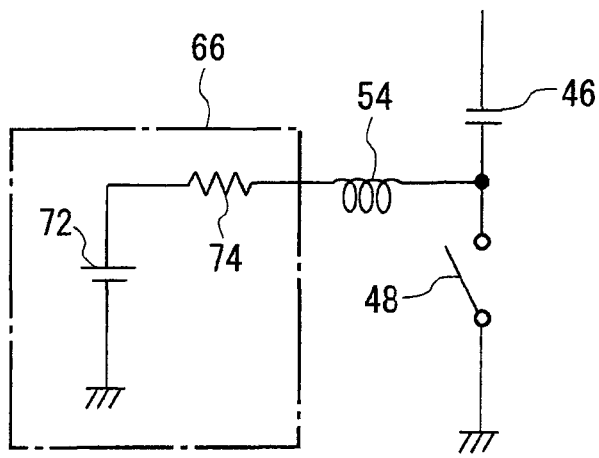
FIG. 4 shows a first example of the configuration of a bias application circuit 66.
Figure 5:
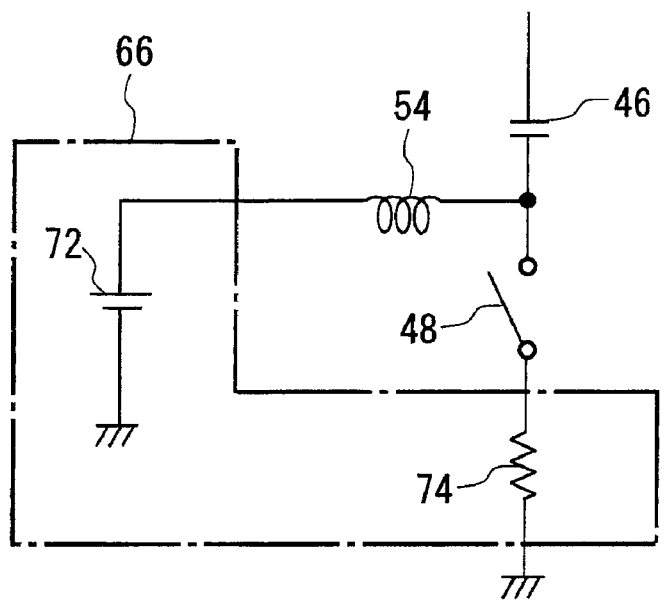
FIG. 5 shows a second example of the configuration of the bias application circuit 66.

FIG. 4 shows a first example of the configuration of the bias application circuit 66, together with the capacitor 46, the second semiconductor switch 48, and the inductor 54. FIG. 5 shows a second example of the configuration of the bias application circuit 66, together with the capacitor 46, the second semiconductor switch 48, and the inductor 54. The bias application circuit 66 may include a constant voltage source 72 and a current restriction resistance 74, for example. The constant voltage source 72 applies a bias voltage to the connection point between the capacitor 46 and the second semiconductor switch 48. The current restriction resistance 74 restricts the amount of current flowing to the second semiconductor switch 48 from the constant voltage source 72. As in FIG. 4, the constant voltage source 72 may be provided between the constant voltage source 72 and the second semiconductor switch 48. The constant voltage source 72 may also be provided between the second semiconductor switch 48 and the ground potential, as shown in FIG. 5.

The bias application circuit 66 having the above-described configuration can apply a predetermined bias voltage to the connection point between the capacitor 46 and the second semiconductor switch 48 when the second semiconductor switch 48 is opened, i.e., when there is a short-circuit between the input terminal 62 and the output terminal 64. The bias application circuit 66 can also restrict the current flowing to the second semiconductor switch 48 while not breaking the second semiconductor switch 48 for example, when the second semiconductor switch 48 is short-circuited, i.e., when the input terminal 62 and the output terminal 64 are opened.

Figure 6:
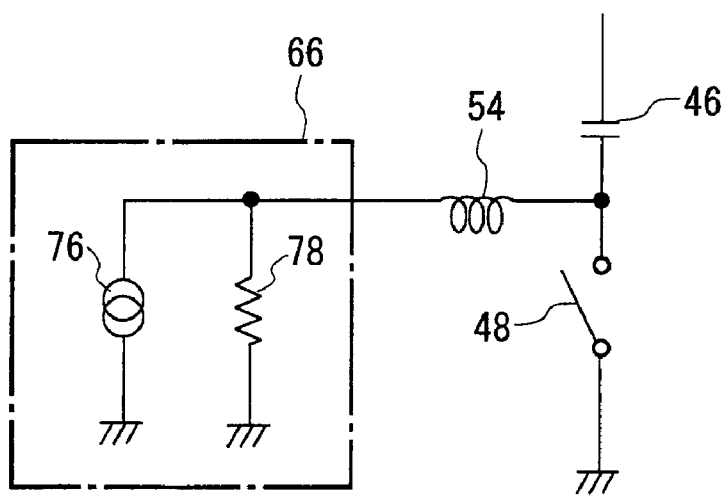
FIG. 6 shows a third example of the configuration of the bias application circuit 66.

FIG. 6 shows a third example of the configuration of the bias application circuit 66, together with the capacitor 46, the second semiconductor switch 48, and the inductor 54. The bias application circuit 66 may include a constant current source 76 and a voltage defining element 78, for example. The constant current source 76 supplies a bias current corresponding to the rated current of the second semiconductor switch 48, to the connection point between the capacitor 46 and the second semiconductor switch 48. The voltage defining element 78 is provided in parallel with the constant current source 76, and defines the bias voltage applied to the connection point by the constant current source 76.

The bias application circuit 66 having the above-described configuration is able to apply a predetermined bias voltage to the connection point between the capacitor 46 and the second semiconductor switch 48, as well as restricting the current flowing to the second semiconductor switch 48 while not breaking the second semiconductor switch 48 for example, when the second semiconductor switch 48 is short-circuited, i.e., when the input terminal 62 and the output terminal 64 are opened.

Figure 7:
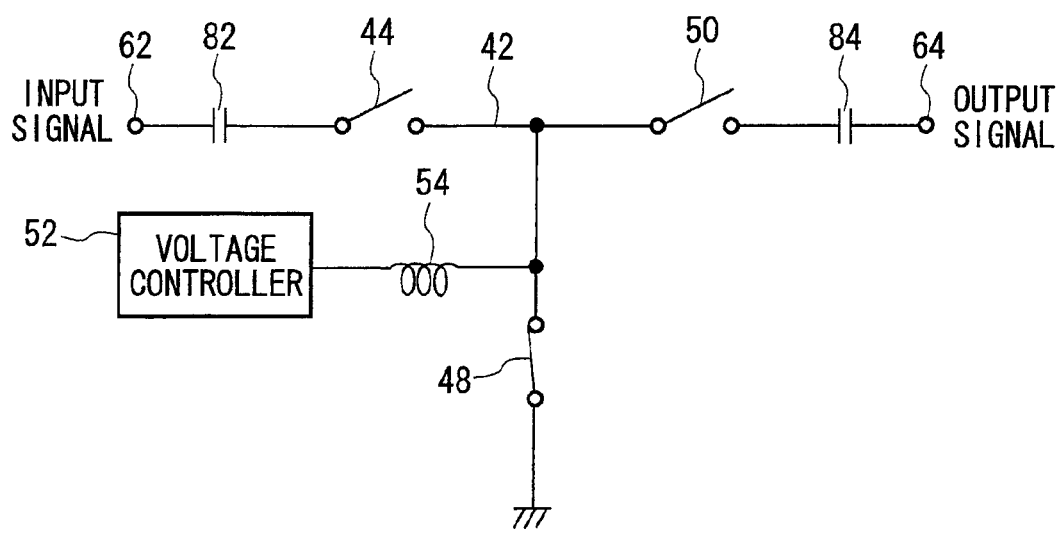
FIG. 7 shows a configuration of a switch circuit 30 according to a second embodiment of the present invention.

FIG. 7 shows a configuration of the switch circuit 30 according to a second embodiment. Note that the second embodiment has substantially the same configuration and function as the first embodiment, and so the same reference numeral is used for substantially the same component between FIG. 7 and FIG. 3, and the explanation thereof is omitted except for the differences therebetween.

In the second embodiment, the switch circuit 30 switches whether to output an input signal of an alternate current. The switch circuit 30 further includes a first capacitor 82 and a second capacitor 84, instead of the capacitor 46. The first capacitor 82 is provided on the transmission path 42 between the first semiconductor switch 44 and the input terminal 62, and has a predetermined capacitance. Because of having a capacitance, the first capacitor 82 inputs an alternate current signal and cuts off input of a direct current signal. The second capacitor 84 is provided on the transmission path 42 between the third semiconductor switch 50 and the output terminal 64, and has a predetermined capacitance. Because of having a capacitance, the second capacitor 84 outputs an alternate current signal, and cuts off output of a direct current signal.

The second semiconductor switch 48 is provided between the transmission path 42 between the first semiconductor switch 44 and the third semiconductor switch 50, and the ground potential. The second semiconductor switch 48 opens the transmission path 42 and the ground potential when the first semiconductor switch 44 is short-circuited, and short-circuits the transmission path 42 and the ground potential when the first semiconductor switch 44 is opened. The voltage controller 52 controls the potential of the connection point between the transmission path 42 and the second semiconductor switch 48.

When the switch circuit 30 having the above-described configuration is controlled to cut off the input from the output, the second semiconductor switch 48 short-circuits the transmission path 42 between the first semiconductor switch 44 and the third semiconductor switch 50, and the ground potential. Accordingly, even when a high-frequency signal inputted via the input terminal 62 or the output terminal 64 has passed the first semiconductor switch 44 or the third semiconductor switch 50, the high-frequency signal can be grounded to the ground potential via the second semiconductor switch 48. Accordingly, the switch circuit 30 does not output the high-frequency signal inputted through the input terminal 62 or the output terminal 64 at the time of opening from the opposite terminal, thereby leading to improvement in insulation property at the time of opening.

When controlled to conduct the input and the output, the second semiconductor switch 48 opens the transmission path 42 between the first semiconductor switch 44 and the third semiconductor switch 50, and the ground potential, and the voltage controller 52 applies a predetermined bias voltage to the connection point between the transmission path 42 between the first semiconductor switch 44 and the third semiconductor switch 50, and the second semiconductor switch 48. Consequently, one end of the second semiconductor switch 48 is provided with the predetermined bias voltage, and the other end thereof is provided with a ground potential. This increases the voltage between terminals, to improve the insulation property of a high-frequency signal. Accordingly, the switch circuit 30 is able to improve the linearity of the transmission characteristic of the transmission path 42 between the input terminal 62 and the output terminal 64 at the time of short-circuit, just as in the first embodiment.

Figure 8:
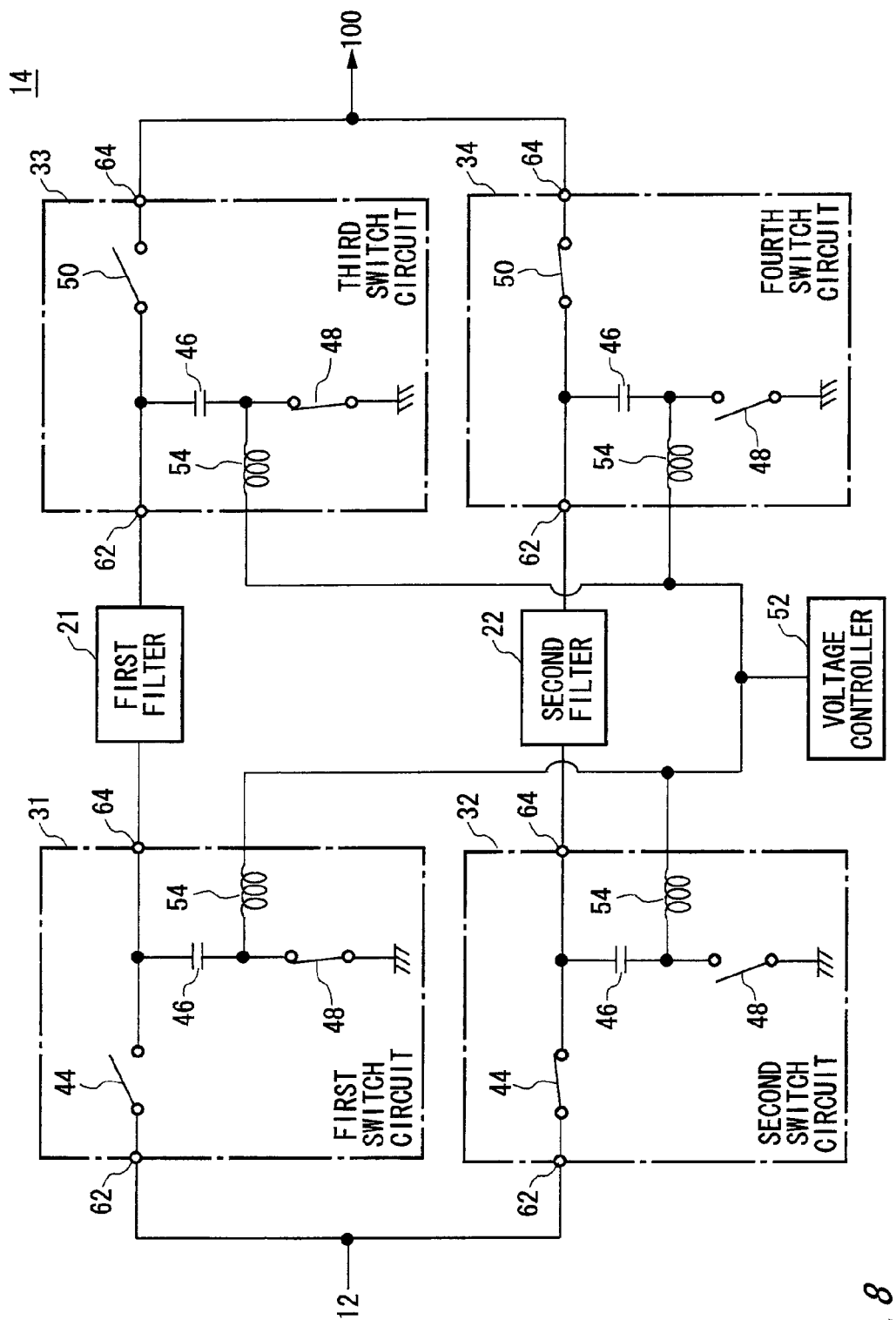
FIG. 8 shows a configuration of a filter circuit 14 according to a third embodiment of the present invention.

FIG. 8 shows a configuration of a filter circuit 14 according to a third embodiment of the present invention. Note that the third embodiment has substantially the same configuration and function as the first embodiment, and so the same reference numeral is used for substantially the same component between FIG. 8, FIG. 2, and FIG. 3, and the explanation thereof is omitted except for the differences therebetween.

In the third embodiment, each of the first through the fourth switch circuits 31-34 includes a voltage controller 52 common to the other switch circuits. Due to this arrangement, the first through the fourth switch circuits 31-34 have a more simplified circuitry configuration in the present embodiment.

Moreover, in the third embodiment, the first switch circuit 31 and the second switch circuit 32 may be a so-called L-shape filter that is not equipped with a third semiconductor switch 50. Moreover, in the present embodiment, the third switch circuit 33 and the fourth switch circuit 34 may be a so-called reverse L-shape filter that is not equipped with a first semiconductor switch 44. Consequently, the first through the fourth switch circuits 31-34 have a more simplified circuitry configuration in the present embodiment.

Although some aspects of the present invention have been described by way of exemplary embodiments, it should be understood that those skilled in the art might make many changes and substitutions without departing from the spirit and the scope of the present invention which is defined only by the appended claims.

The operations, the processes, the steps, or the like in the apparatus, the system, the program, and the method described in the claims, the specification, and the drawings are not necessarily performed in the described order. The operations, the processes, the steps, or the like can be performed in an arbitrary order, unless the output of the former-described processing is used in the later processing. Even when expressions such as "First," or "Next," or the like are used to explain the operational flow in the claims, the specification, or the drawings, they are intended to facilitate the understanding of the invention, and are never intended to show that the described order is mandatory.

As clear from the foregoing, one or more embodiments of the present invention improve the linearity of the transmission characteristic at the time of short-circuit between the input end and the output end.

The invention claimed is:

1. A switch circuit for switching whether to output an input signal, comprising:
    a transmission path that transmits the input signal from an input end to an output end of the switch circuit;
    a first semiconductor switch that is provided on the transmission path and switches whether to transmit the input signal;
    a second semiconductor switch, comprising a first end and a second end, wherein the second semiconductor switch switches whether to open or short circuit between the first end and the second end, wherein the first end of the second semiconductor switch is connected to a point on the transmission path between the first semiconductor switch and the output end of the switch circuit, and the second end of the second semiconductor switch is connected to a ground potential, wherein the second semiconductor switch is opened when the first semiconductor switch is short-circuited, and wherein the second semiconductor switch is short-circuited when the first semiconductor switch is opened;
    a capacitor having a predetermined capacitance, one end of the capacitor being connected to the point on the transmission path between the first semiconductor switch and the output end of the switch circuit and another end of the capacitor being connected to the first end of the second semiconductor switch, wherein the second semiconductor switch and the capacitor are connected in series between the transmission path and the ground potential;
    a voltage controller, including a bias application circuit connected to a point between the capacitor and the first end of the second semiconductor switch, configured to control the bias application circuit to apply a bias voltage to the point between the capacitor and the first end of the second semiconductor switch when the second semiconductor switch is opened; and
    an inductor, having a predetermined inductance, that is provided between the bias application circuit and the point between the capacitor and the first end of the second semiconductor switch.

2. The switch circuit according to claim 1, wherein the bias application circuit applies the bias voltage corresponding to a rated voltage of the second semiconductor switch.

3. The switch circuit according to claim 1, wherein the bias application circuit includes:
    a constant voltage source that applies the bias voltage to the point between the capacitor and the first end of the second semiconductor switch; and
    a current restriction resistance that restricts an amount of current flowing to the second semiconductor switch from the constant voltage source.

4. The switch circuit according to claim 3, wherein the current restriction resistance is provided between the constant voltage source and the first end of the second semiconductor switch.

5. The switch circuit according to claim 3, wherein the current restriction resistance is provided between the second end of the second semiconductor switch and the ground potential.

6. The switch circuit according to claim 1, wherein the bias application circuit includes:
    a constant current source that supplies a bias current corresponding to a rated current of the second semiconductor switch, to the point between the capacitor and the first end of the second semiconductor switch; and
    a voltage defining element that is provided in parallel with the constant current source and defines the bias voltage applied by the constant current source to the point between the capacitor and the first end of the second semiconductor switch.

7. The switch circuit according to claim 1, further comprising:
    a third semiconductor switch that is provided on the transmission path between the first semiconductor switch and the output end, and operates in synchronization with the first semiconductor switch,
    wherein the second semiconductor switch is opened when the first semiconductor switch and the third semiconductor switch are short-circuited, and is short-circuited when the first semiconductor switch and the third semiconductor switch are opened.

8. A switch circuit for switching whether to output an input signal comprising:
    a transmission path that transmits the input signal from an input end to an output end of the switch circuit;
    a first semiconductor switch that is provided on the transmission path and switches whether to transmit the input signal;
    a third semiconductor switch that is provided on the transmission path between the first semiconductor switch and the output end of the switch circuit;
    a second semiconductor switch comprising a first end and a second end, wherein the second semiconductor switch switches whether to open or short circuit between the first end and the second end, wherein the first end of the second semiconductor switch is connected to a point on the transmission path between the first semiconductor switch and the third semiconductor switch, and the second end of the second semiconductor switch is connected to a ground potential;
    wherein the third semiconductor switch switches whether to transmit the input signal output from the first semiconductor switch in synchronization with the first semiconductor switch, and wherein the second semiconductor switch is opened when the first semiconductor switch and the third semiconductor switch are short-circuited, and is short-circuited when the first semiconductor switch and the third semiconductor switch are opened;
    a first capacitor, having a predetermined capacitance, that is provided on the transmission path between the first semiconductor switch and the input end;
    a second capacitor, having a predetermined capacitance, that is provided on the transmission path between the third semiconductor switch and the output end;
    a voltage controller, including a bias application circuit connected to the first end of the second semiconductor switch, configured to control the bias application circuit to apply a bias voltage to the first end of the second semiconductor switch when the second semiconductor switch is opened; and an inductor, having a predetermined inductance, that is provided between the bias application circuit, and the first end of the second semiconductor switch.

9. A filter circuit for allowing a predetermined frequency component of an input signal to pass through, comprising:
   a first filter and a second filter that have different frequency characteristics from each other that determine which frequency component of the input signal is allowed to pass therethrough;
   a first switch circuit that switches whether to input the input signal to the first filter;
   a second switch circuit that switches whether to input the input signal to the second filter;
   a third switch circuit that switches whether to output a signal having passed through the first filter;
   a fourth switch circuit that switches whether to output a signal having passed through the second filter; and
   a voltage controller,
   wherein the first and third switch circuits are short-circuited, and the second and fourth switch circuits are opened when the frequency component of the input signal determined by the frequency characteristic of the first filter is passed,
   wherein the first and third switch circuits are opened, and the second and fourth switch circuits are short-circuited when the frequency component of the input signal determined by the frequency characteristic of the second filter is passed,
   wherein each of the first switch circuit and the second switch circuit includes:
      a transmission path that transmits the input signal from an input end to an output end of the switch circuit;
      a first semiconductor switch that is provided on the transmission path and switches whether to transmit the input signal;
      a second semiconductor switch, provided between the transmission path and a ground potential, that switches whether to open or short-circuit between the transmission path and the ground potential, wherein the second semiconductor switch is opened when the first semiconductor switch is short-circuited, and wherein the second semiconductor switch is short-circuited when the first semiconductor switch is opened; and
      a capacitor having a predetermined capacitance, one end of the capacitor being connected to a point on the transmission path between the first semiconductor switch and the output end and another end of the capacitor being connected to one end of the second semiconductor switch, wherein another end of the second semiconductor switch is connected to the ground potential,
   wherein each of the third switch circuit and the fourth switch circuit includes:
      a transmission path that transmits the input signal from an input end to an output end of the switch circuit;
      a first semiconductor switch that is provided on the transmission path and switches whether to transmit the input signal;
      a second semiconductor switch, provided between the transmission path and a ground potential, that switches whether to open or short-circuit between the transmission path and the ground potential, wherein the second semiconductor switch is opened when the first semiconductor switch is short-circuited, and wherein the second semiconductor switch is short-circuited when the first semiconductor switch is opened; and
      a capacitor having a predetermined capacitance, one end of the capacitor being connected to a point on the transmission path between the input end and the first semiconductor switch, and another end of the capacitor being connected to one end of the second semiconductor switch, wherein another end of the second semiconductor switch is connected to the ground potential,
   wherein the voltage controller includes a bias application circuit connected to a point between the capacitor and the second semiconductor switch in each of the first, second, third, and fourth switch circuits, and is configured to control the bias application circuit to apply a bias voltage to the point between the capacitor and the second semiconductor switch therein when the second semiconductor switch therein is opened, and
   wherein each of the first, second, third and fourth switch circuits further includes an inductor, having a predetermined inductance, that is provided between the bias application circuit, and the point between the capacitor and the second semiconductor switch therein.

10. The filter circuit according to claim 9, wherein each of the first switch circuit and the second switch circuit further includes:
   a third semiconductor switch that is provided on the transmission path between the point of the transmission path and the output end, and switches whether to transmit the input signal in synchronization with the first semiconductor switch;
   a first capacitor that is provided on the transmission path between the first semiconductor switch and the input end, and has a predetermined capacitance; and
   a second capacitor that is provided on the transmission path between the third semiconductor switch and the output end, and has a predetermined capacitance, and
   the second semiconductor switch in each of the first switch circuit and the second switch circuit is opened when the first semiconductor switch and the third semiconductor switch therein are short-circuited, and is short-circuited when the first semiconductor switch and the third semiconductor switch are opened.

11. A test apparatus for testing a device under test, the test apparatus comprising:
   a signal generator that generates a test signal to be inputted to the device under test;
   a filter circuit that allows a predetermined frequency component of the test signal to pass through to be inputted to the device under test; and
   a determining section that determines whether the device under test is defective or not, based on an output signal outputted by the device under test in response to the test signal,
   wherein the filter circuit includes:
      a first filter and a second filter that have different frequency characteristics from each other that determine which frequency component of the test signal is allowed to pass therethrough;
      a first switch circuit that switches whether to input the test signal to the first filter;
      a second switch circuit that switches whether to input the test signal to the second filter;
      a third switch circuit that switches whether to output a signal having passed through the first filter;

a fourth switch circuit that switches whether to output a signal having passed through the second filter; and
a voltage controller,
wherein the first and third switch circuits are short-circuited, and the second and fourth switch circuits are opened when the frequency component of the input signal determined by the frequency characteristic of the first filter is passed,
wherein the first and third switch circuits are opened, and the second and fourth switch circuits are short-circuited when the frequency component of the input signal determined by the frequency characteristic of the second filter is passed,
wherein each of the first switch circuit and the second switch circuit includes:
a transmission path that transmits the test signal from an input end to an output end of the switch circuit;
a first semiconductor switch that is provided on the transmission path and switches whether to transmit the test signal;
a second semiconductor switch, provided between the transmission path and a ground potential, that switches whether to open or short-circuit between the transmission path and the ground potential, wherein the second semiconductor switch is opened when the first semiconductor switch is short-circuited, and wherein the second semiconductor switch is short-circuited when the first semiconductor switch is opened; and
a capacitor having a predetermined capacitance, one end of the capacitor being connected to a point on the transmission path between the first semiconductor switch and the output end and another end of the capacitor being connected to one end of the second semiconductor switch, wherein another end of the second semiconductor switch is connected to the ground potential,
wherein each of the third switch circuit and the fourth switch circuit includes:
a transmission path that transmits the input signal from an input end to an output end of the switch circuit;
a first semiconductor switch that is provided on the transmission path and switches whether to transmit the input signal;
a second semiconductor switch, provided between the transmission path and a ground potential, that switches whether to open or short-circuit between the transmission path and the ground potential, wherein the second semiconductor switch is opened when the first semiconductor switch is short-circuited, and wherein the second semiconductor switch is short-circuited when the first semiconductor switch is opened; and
a capacitor having a predetermined capacitance, one end of the capacitor being connected to a point on the transmission path between the input end and the first semiconductor switch, and another end of the capacitor being connected to one end of the second semiconductor switch, wherein another end of the second semiconductor switch is connected to the ground potential,
wherein the voltage controller includes a bias application circuit connected to a point between the capacitor and the second semiconductor switch in each of the first, second, third, and fourth switch circuits, and is configured to control the bias application circuit to apply a bias voltage to the point between the capacitor and the second semiconductor switch therein when the second semiconductor switch therein is opened, and wherein each of the first, second, third and fourth switch circuits further includes an inductor, having a predetermined inductance, that is provided between the bias application circuit, and the point between the capacitor and the second semiconductor switch therein.

12. The test apparatus according to claim 11, wherein each of the first switch circuit and the second switch circuit further includes:
a third semiconductor switch that is provided on the transmission path between the point of the transmission path and the output end, and switches whether to transmit the input signal in synchronization with the first semiconductor switch;
a first capacitor that is provided on the transmission path between the first semiconductor switch and the input end, and has a predetermined capacitance; and
a second capacitor that is provided on the transmission path between the third semiconductor switch and the output end, and has a predetermined capacitance, and
the second semiconductor in each of the first switch circuit and the second switch circuit is opened when the first semiconductor switch and the third semiconductor switch therein are short-circuited, and is short-circuited when the first semiconductor switch and the third semiconductor switch therein are opened.

13. A switch circuit for switching whether to output an input signal, comprising:
a transmission path that transmits the input signal from an input end to an output end of the switch circuit;
a first semiconductor switch that is provided on the transmission path and switches whether to transmit the input signal;
a second semiconductor switch, comprising a first end and a second end, wherein the second semiconductor switch switches whether to open or short circuit between the first end and the second end, wherein the first end of the second semiconductor switch is connected to a point on the transmission path between the first semiconductor switch and the input end of the switch circuit, and the second end of the second semiconductor switch is connected to a ground potential, wherein the second semiconductor switch is opened when the first semiconductor switch is short-circuited, and wherein the second semiconductor switch is short-circuited when the first semiconductor switch is opened;
a capacitor having a predetermined capacitance, one end of the capacitor being connected to the point on the transmission path between the input end of the switch circuit and the first semiconductor switch and another end of the capacitor being connected to the first end of the second semiconductor switch, and wherein the second semiconductor switch and the capacitor are connected in series between the transmission path and the ground potential;
a voltage controller, including a bias application circuit connected to a point between the capacitor and the first end of the second semiconductor switch, configured to control the bias application circuit to apply a bias voltage to the point between the capacitor and the first end of the second semiconductor switch when the second semiconductor switch is opened; and
an inductor, having a predetermined inductance, that is provided between the bias application circuit and the point between the capacitor and the first end of the second semiconductor switch.

* * * * *